United States Patent
Jeong et al.

(10) Patent No.: US 8,927,367 B2
(45) Date of Patent: Jan. 6, 2015

(54) SEMICONDUCTOR DEVICE INCLUDING METAL-OXIDE-SEMICONDUCTOR FIELD EFFECT TRANSISTORS AND METHODS OF FABRICATING THE SAME

(71) Applicant: Samsung Electronics Co., Ltd., Suwon-Si (KR)

(72) Inventors: Yongsang Jeong, Hwaseong-si (KR); Vladimir Urazaev, Suwon-si (KR); Jin Ha Jeong, Yongin-si (KR); Changhun Lee, Ansan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 13 days.

(21) Appl. No.: 13/736,457

(22) Filed: Jan. 8, 2013

(65) Prior Publication Data
US 2013/0224920 A1    Aug. 29, 2013

(30) Foreign Application Priority Data

Feb. 27, 2012  (KR) .................. 10-2012-0019767

(51) Int. Cl.
*H01L 21/336*    (2006.01)
*H01L 29/66*     (2006.01)

(52) U.S. Cl.
CPC .............................. *H01L 29/66666* (2013.01)
USPC .................................................... 438/270

(58) Field of Classification Search
None
See application file for complete search history.

(56) References Cited

U.S. PATENT DOCUMENTS

| | | | | |
|---|---|---|---|---|
| 4,861,729 A * | 8/1989 | Fuse et al. | | 438/246 |
| 4,994,409 A * | 2/1991 | Yoon et al. | | 438/9 |
| 5,100,823 A * | 3/1992 | Yamada | | 438/243 |
| 5,298,780 A * | 3/1994 | Harada | | 257/330 |
| 6,274,437 B1 * | 8/2001 | Evans | | 438/272 |
| 6,444,528 B1 * | 9/2002 | Murphy | | 438/270 |
| 6,489,204 B1 * | 12/2002 | Tsui | | 438/270 |
| 6,717,200 B1 * | 4/2004 | Schamberger et al. | | 257/302 |
| 6,987,040 B2 * | 1/2006 | Venkatraman | | 438/212 |
| 7,176,104 B1 * | 2/2007 | Chen et al. | | 438/424 |
| 7,592,229 B2 | 9/2009 | Lin | | |
| 7,625,799 B2 | 12/2009 | Yilmaz et al. | | |
| 7,678,676 B2 | 3/2010 | Lee et al. | | |
| 7,679,137 B2 | 3/2010 | Lee et al. | | |
| 7,687,852 B2 | 3/2010 | Rouh et al. | | |
| 7,768,066 B2 | 8/2010 | Onose et al. | | |
| 7,781,303 B2 * | 8/2010 | Zhao | | 438/424 |
| 7,843,020 B2 | 11/2010 | Hayashi | | |
| 7,915,673 B2 | 3/2011 | Mouli | | |

(Continued)

FOREIGN PATENT DOCUMENTS

| | | | |
|---|---|---|---|
| JP | 2003273354 A | 9/2003 | |
| JP | 2007059632 A | 3/2007 | |
| KR | 20050122474 A | 12/2005 | |
| KR | 100598172 B1 | 7/2006 | |

*Primary Examiner* — Scott B Geyer
(74) *Attorney, Agent, or Firm* — Harness, Dickey & Pierce, P.L.C.

(57) ABSTRACT

A method of fabricating a semiconductor device may include patterning a substrate to form trenches, forming a sacrificial layer to cover inner surfaces of the trenches, the sacrificial layer having a single-layered structure, forming sacrificial patterns by isotropically etching the sacrificial layer such that the sacrificial layer remains on bottom surfaces of the trenches, forming lightly doped regions in sidewalls of the trenches using the sacrificial patterns as an ion mask, removing the sacrificial patterns, and sequentially forming a gate insulating layer and a gate electrode layer in the trenches.

19 Claims, 7 Drawing Sheets

(56) References Cited

U.S. PATENT DOCUMENTS

| | | |
|---|---|---|
| 7,948,028 B2 | 5/2011 | Renn |
| 2007/0161172 A1 | 7/2007 | Lin |
| 2007/0246755 A1 | 10/2007 | Lee et al. |
| 2007/0249123 A1* | 10/2007 | Chou et al. .................... 438/270 |
| 2008/0073731 A1 | 3/2008 | Hayashi |
| 2009/0032821 A1 | 2/2009 | Onose et al. |
| 2009/0114966 A1 | 5/2009 | Renn |
| 2009/0173996 A1 | 7/2009 | Rouh et al. |
| 2009/0191678 A1 | 7/2009 | Yilmaz et al. |
| 2010/0015775 A1 | 1/2010 | Lee et al. |
| 2010/0133607 A1 | 6/2010 | Mouli |
| 2011/0049618 A1* | 3/2011 | Lee et al. ..................... 257/330 |

* cited by examiner

SEMICONDUCTOR DEVICE INCLUDING METAL-OXIDE-SEMICONDUCTOR FIELD EFFECT TRANSISTORS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0019767, filed on Feb. 27, 2012, in the Korean Intellectual Property Office, the entire contents of which are hereby incorporated by reference.

BACKGROUND

1. Field

Example embodiments of the inventive concepts are related to a semiconductor device and a method of fabricating the same. For example, example embodiments of the inventive concepts are related to a semiconductor device including metal-oxide-semiconductor field effect transistors (MOSFETs) and a method of fabricating the same.

2. Description of the Related Art

As a consequence of the high integration of semiconductor devices, it is becoming harder to realize improvement in transistor performance required by the customers. To overcome these technical difficulties, there have been suggested a variety of field effect transistor structures. For example, in the case of an analog circuit requiring improved matching characteristics, constituent parts thereof (e.g., transistors) have been developed to have higher uniformity in terms of electric characteristics.

However, the transistors may have different structural/geometrical properties, according to their positions in a chip or arrangement of neighboring patterns, and furthermore, some electric characteristics of the transistor may be sensitively dependent on the structural/geometrical properties. For example, in the case of transistors constituting a high voltage circuit, a variation of several percent in channel length may be amplified into a variation of several tens to hundreds percent in electric characteristics, thereby making it difficult to realize the high uniformity in terms of electric characteristics.

SUMMARY

Example embodiments of the inventive concepts provide a transistor, semiconductor device and method of fabricating a transistor with improved uniformity in structural and electric characteristics.

According to example embodiments of the inventive concepts, a method of fabricating a semiconductor device may include patterning a substrate to form trenches, forming a sacrificial layer to cover inner surfaces of the trenches, the sacrificial layer having a single-layered structure, forming sacrificial patterns by isotropically etching the sacrificial layer such that the sacrificial layer remains on bottom surfaces of the trenches, forming lightly doped regions in sidewalls of the trenches using the sacrificial patterns as an ion mask, removing the sacrificial patterns, and sequentially forming a gate insulating layer and a gate electrode layer in the trenches.

In example embodiments, the sacrificial layer may be formed to have a greater thickness on the bottom surfaces of the trenches than on the sidewalls of the trenches. In example embodiments, the sacrificial layer may be formed at least two times thicker on the bottom surfaces of the trenches than on the sidewalls of the trenches. In example embodiments, the sacrificial layer may be formed using a physical vapor deposition process.

In example embodiments, the substrate may be patterned to form first and second trenches having different depths from each other. In example embodiments, the first and second sacrificial patterns may be formed on bottom surfaces of the first and second trenches, respectively. In example embodiments, a difference in thickness between the first and second sacrificial patterns may be smaller than one-fourth of a difference in depth between the first and second trenches.

In example embodiments, the buffer layer may be formed to cover the inner surfaces of the trenches before forming the sacrificial layer, and the buffer layer may be removed to expose the inner surfaces of the trenches after the removing the sacrificial patterns. In example embodiments, the buffer layer may be a silicon oxide layer, and the sacrificial layer may be formed of a material having an etch selectivity with respect to the buffer layer.

In example embodiments, before sequentially forming the gate insulating layer and the gate electrode layer in the trenches, electrode separation patterns may be formed to remain locally on upper sidewalls of the trenches, respectively. In example embodiments, forming the electrode separation patterns may include forming a trench insulating layer to fill the trenches after the removing the sacrificial patterns, patterning an upper portion of the trench insulating layer to form gaps spaced apart from the lightly doped regions, forming spacers on sidewalls of the gaps, and removing a lower portion of the trench insulating layer using the spacers.

In example embodiments, after sequentially forming the gate insulating layer and the gate electrode layer in the trenches, heavily doped regions may be formed in an upper region of the substrate to be connected to the lightly doped regions. In example embodiments, the sacrificial patterns may be removed by laterally etching the sidewalls of the trenches exposed by the sacrificial patterns, such that a width of the trenches has a minimum value at a vertical position of the sacrificial patterns.

According to example embodiments of the inventive concepts, a semiconductor device may include a substrate having first and second trenches, a gate insulating layer covering inner surfaces of the first and second trenches, a gate electrode filling the first and second trenches, a first lightly doped region formed in a sidewall of the first trench, and a second lightly doped region formed in a sidewall of the second trench. The first and second trenches may have different depths from each other, and a difference in height between bottom surfaces of the first lightly doped region and the first trench may be smaller than a difference in height between bottom surfaces of the second lightly doped region and the second trench.

In example embodiments, the first trench may be the shallowest of the first and second trenches. In example embodiments, a difference in height between the bottom surfaces of the first and second lightly doped regions may be smaller than one fourth of that between the bottom surfaces of the first and second trenches.

In example embodiments, the device may include heavily doped regions in a top surface of the substrate, each of the heavily doped regions being connected to a corresponding one of the first and second lightly doped regions, and electrode separation patterns on upper sidewalls of the first and second trenches such that an interval between the heavily doped regions and the gate electrode increases. In example embodiments, the widths of the first and second trenches may decrease monotonically with decreasing distance from the bottom surfaces of the first and second trenches.

According to example embodiments of the inventive concepts, a method of fabricating a semiconductor device may include forming a sacrificial layer to cover inner surfaces and a bottom surface of trenches formed in a substrate, forming sacrificial patterns by isotropically etching the sacrificial layer such that the sacrificial layer remains on bottom surfaces of the trenches, and forming lightly doped regions on the exposed inner surfaces of the trenches.

In example embodiments, the method may include removing the sacrificial patterns, and sequentially forming a gate insulating layer and a gate electrode layer in the trenches. In example embodiments, forming the lightly doped regions may include using the sacrificial patterns as an ion mask. In example embodiments, the sacrificial layer may be formed to have a single-layered structure. In example embodiments, the sacrificial layer may be formed to have a greater thickness on the bottom surfaces of the trenches than on the inner surfaces of the trenches. In example embodiments, the sacrificial layer may be formed at least two times thicker on the bottom surfaces of the trenches than on the inner surfaces of the trenches.

In example embodiments, the sacrificial layer may be formed using a physical vapor deposition process. In example embodiments, a buffer layer may be formed to cover the inner surfaces of the trenches before the forming a sacrificial layer, and the buffer layer may be removed to expose the inner surfaces of the trenches after the removing the sacrificial patterns. In example embodiments, the buffer layer may be a silicon oxide layer, and the sacrificial layer may be formed a material having an etch selectivity with respect to the buffer layer.

BRIEF DESCRIPTION OF THE DRAWINGS

Example embodiments will be more clearly understood from the following brief description taken in conjunction with the accompanying drawings.

FIG. 1 is a plan view illustrating a semiconductor device according to example embodiments of the inventive concepts.

FIGS. 2 through 5 are sectional views illustrating a method of fabricating a semiconductor device according to example embodiments of the inventive concepts.

FIGS. 6 through 8 are sectional views illustrating a method of fabricating a semiconductor device according to example embodiments of the inventive concepts.

FIGS. 9 through 12 are sectional views illustrating a method of fabricating a semiconductor device according to example embodiments of the inventive concepts.

FIGS. 13 and 14 are block diagrams schematically illustrating electronic devices including a semiconductor device according to example embodiments of inventive concepts.

Figure 1:
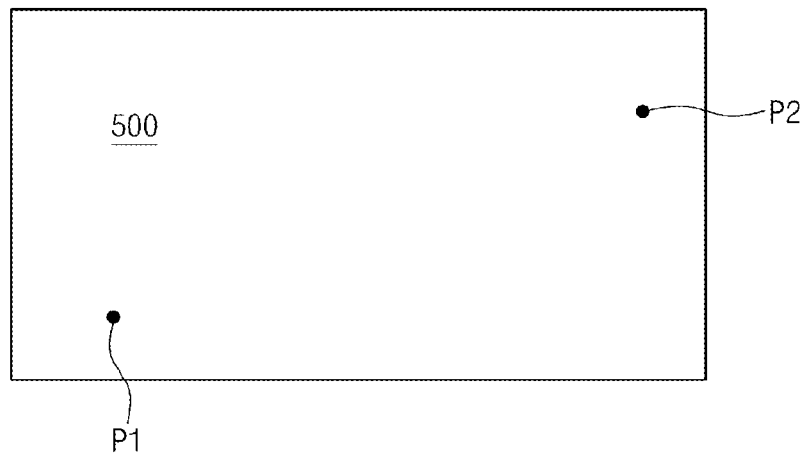
FIGS. 1 through 14 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 6:
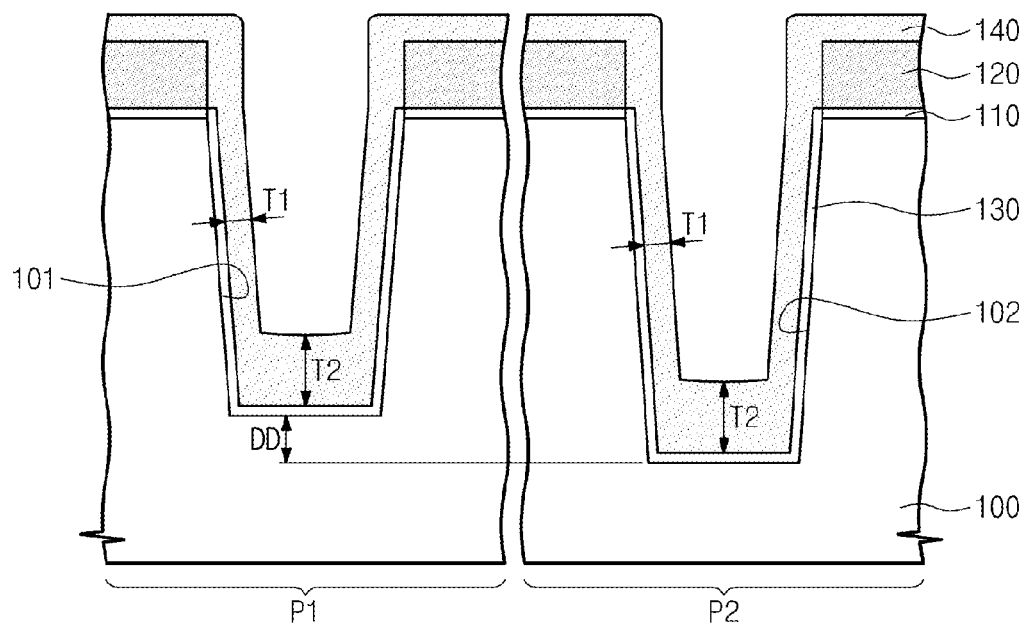
Figure 7:
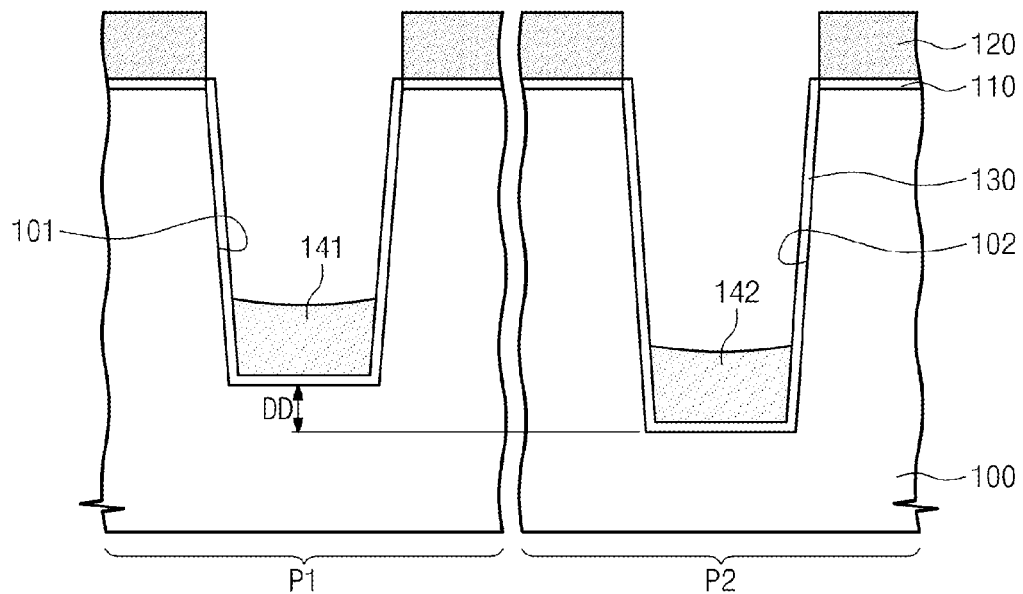
Figure 8:
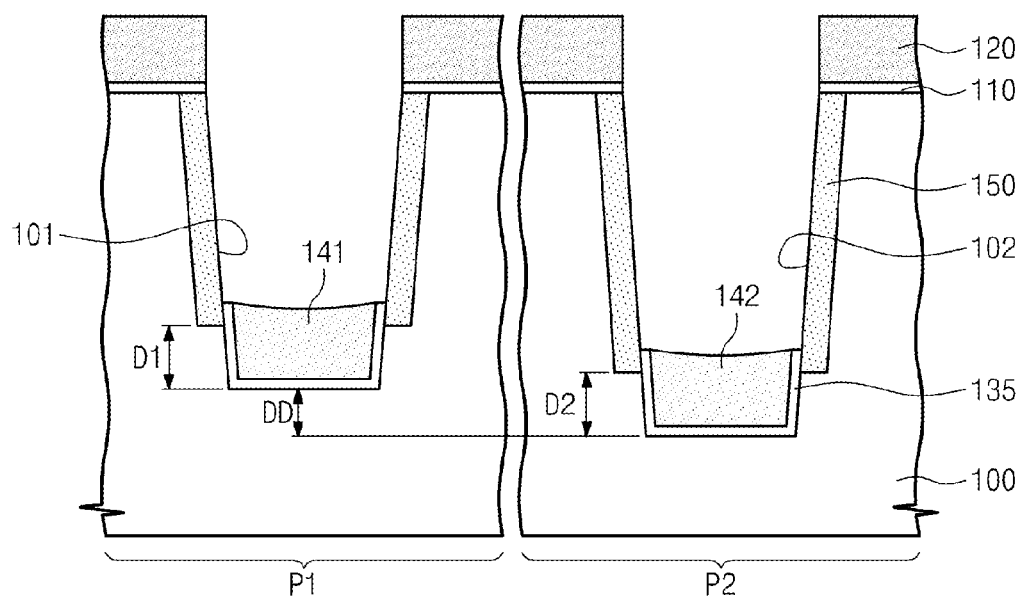

FIG. 1 is a plan view illustrating a semiconductor device according to example embodiments of the inventive concepts. FIGS. 2 through 5 are sectional views illustrating a method of fabricating a semiconductor device according to example embodiments of the inventive concepts, and FIGS. 6 through 8 are sectional views illustrating a method of fabricating a semiconductor device according to other example embodiments of the inventive concepts.

Referring to FIG. 1, a semiconductor device according to the inventive concepts may be a semiconductor chip 500 with a first position P1 and a second position P2. As will be described below, trenches may be formed in the semiconductor chip 500, and gate electrodes may be disposed in the trenches. The first position P1 may be a position of the shallowest one of the trenches formed in the semiconductor chip 500, and the second position P2 may be a position of the deepest one of the trenches formed in the semiconductor chip 500.

In example embodiments, the first and second positions P1 and P2 may be portions of an n-type metal-oxide-semiconductor (NMOS) or a p-type metal-oxide-semiconductor (PMOS) field effect transistor. In other example embodiments, the field effect transistor provided at the first position P1 may have a different conductive type from the field effect transistor at the second position P2. For example, an NMOS field effect transistor may be provided at the first position P1, and a PMOS field effect transistor may be provided at the second position P2.

Figure 2:
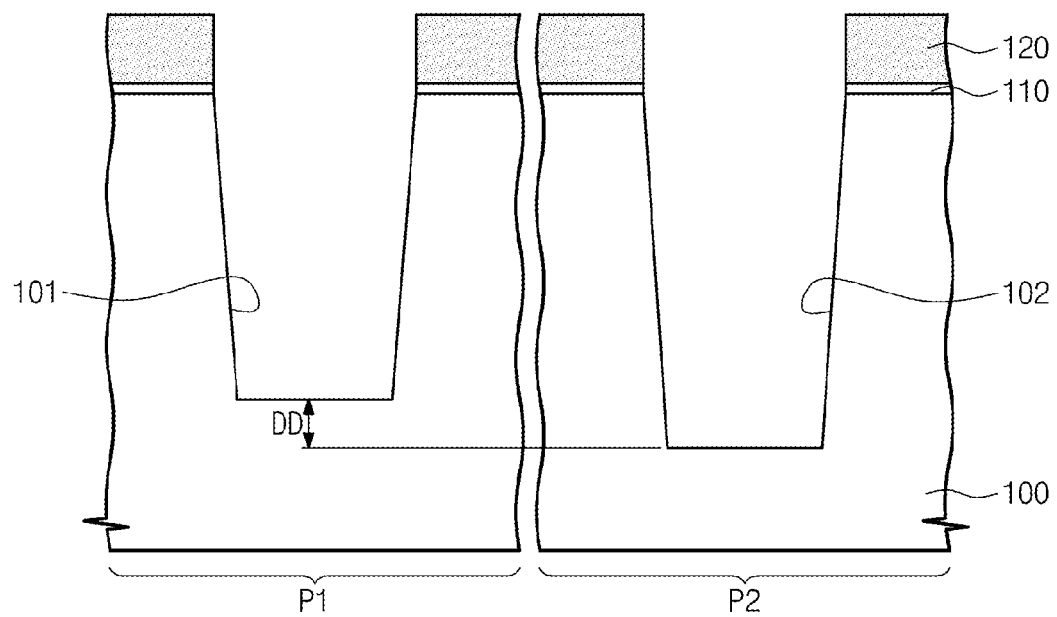

Referring to FIGS. 1 and 2, trenches may be formed in a substrate 100. The trenches may include a first trench 101 formed at the first position P1 and a second trench 102 formed at the second position P2.

In example embodiments, the formation of the trenches may include forming first and second mask patterns 110 and 120 sequentially stacked on the substrate 100, and then anisotropically etching the substrate 100 using the first and second mask patterns 110 and 120 as an etch mask.

In example embodiments, the second mask pattern 120 may be formed of a material having an etch selectivity with respect to the first mask pattern 110 and/or the substrate 100, the first mask pattern 110 may be formed of a material capable of reducing technical difficulties (for example, a stress caused by a difference in thermal expansion coefficient), which may result from a direct contact between the second mask pattern 120 and the substrate 100. For example, the second mask pattern 120 may be formed using a silicon nitride layer, and the first mask pattern 110 may be formed using a silicon oxide layer.

The etching of the substrate 100 may be performed using an etch recipe, which is selected to reduce a difference in depth between the first and second trenches 101 and 102. For all that, the first and second positions P1 and P2 may be formed to have different depths from each other, due to difference in terms of spatial position thereof or arrangement structure of neighboring patterns. Accordingly, as shown in FIG. 2, there may be a depth difference DD between the first and second trenches 101 and 102.

Figure 3:
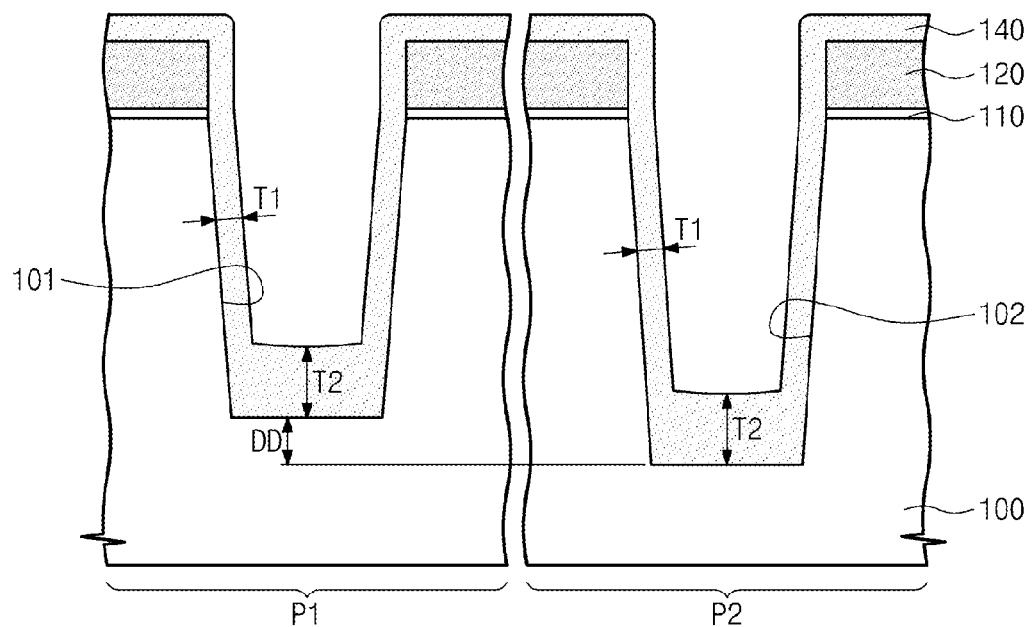

Referring to FIGS. 1 and 3, a sacrificial layer 140 may be formed to cover inner surfaces of the trenches. The sacrificial layer 140 may be formed of one of several materials having an etch selectivity with respect to the substrate 100. For example, the sacrificial layer 140 may be one of a silicon nitride layer or a silicon oxide layer.

According to example embodiments, the sacrificial layer 140 may be formed to have a thickness greater on a bottom surface of the trench than a sidewall of the trench (e.g., T2>T1). For example, the thickness T2 of the sacrificial layer 140 on the bottom surface of the trench may be greater than the thickness T1 thereof on the sidewall of the same trench. According to example embodiments, the sacrificial layer 140 may be the substantially same in terms of its thickness T2 on the bottom surface of the trench, regardless of its position in the semiconductor chip 500. For example, the maximum difference in the thickness of the sacrificial layer 140 on the bottom surface of the trench may be smaller than the maximum difference (e.g., DD) in the depth of the trenches. In example embodiments, the sacrificial layer 140 may be a silicon nitride layer formed using a physical vapor deposition process, but example embodiments of the inventive concepts may not be limited thereto.

In example embodiments, as shown in FIG. 6, before the formation of the sacrificial layer 140, a buffer layer 130 may be further formed to cover the inner surfaces of the trenches. The buffer layer 130 may be formed of a material capable of reducing technical difficulties (for example, a stress caused by a difference in thermal expansion coefficient), which may result from a direct contact between the sacrificial layer 140 and the substrate 100. For example, the sacrificial layer 140 may be formed using a silicon nitride layer, and the buffer layer 130 may be formed using a silicon oxide layer. The buffer layer 130 may be formed using a thermal oxidation process, a chemical vapor deposition process or an atomic layer deposition process, but example embodiments of the inventive concepts may not be limited thereto.

Figure 4:
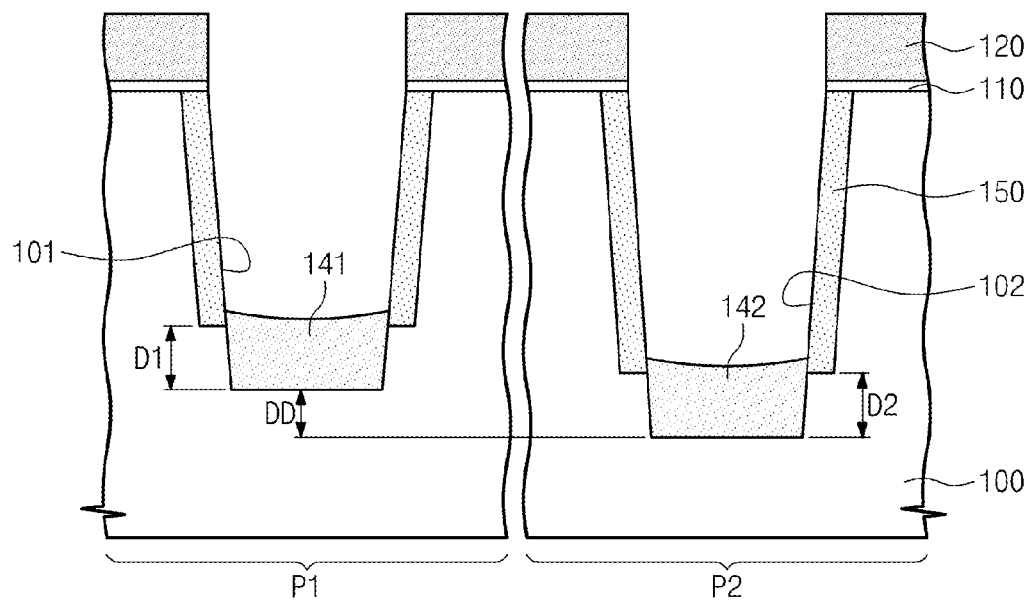

Referring to FIGS. 1 and 4, the sacrificial layer 140 may be etched to form sacrificial patterns locally remaining on lower regions of the trenches. The sacrificial patterns may include a first sacrificial pattern 141 remaining on the bottom surface of the first trench 101 and a second sacrificial pattern 142 remaining on a bottom surface of the second trench 102.

As described above, the sacrificial layer 140 may be formed to have the same bottom thickness, regardless of its position in the semiconductor chip 500, and thus, the first and second sacrificial patterns 141 and 142 may have the substantially same thickness.

The etching of the sacrificial layer 140 may be isotropically performed using an etch recipe having an etch selectivity with respect to the substrate 100. As described with reference to FIG. 6, in the case in which the buffer layer 130 is provided, the etch recipe may be selected to have an etch selectivity with respect to the buffer layer 130. Accordingly, as shown in FIG. 7, the buffer layer 130 may remain on the sacrificial patterns 141 and 142 to cover sidewalls of the trenches 101 and 102.

In example embodiments, in the case in which the second mask pattern 120 does not have a high etch selectivity with respect to the sacrificial layer 140, at least a portion of the second mask pattern 120 may be etched during the formation of the sacrificial patterns 141 and 142.

Referring back to FIG. 4, lightly doped regions 150 may be formed in the sidewalls of the trenches 101 and 102 using the sacrificial patterns 141 and 142 as an ion mask. Due to the presence of the sacrificial patterns 141 and 142 remaining on bottom surfaces of the trenches 101 and 102, it is possible to prevent or reduce the lightly doped regions 150 from being formed in the bottom surfaces of the trenches 101 and 102. Furthermore, because the sacrificial patterns 141 and 142 have the substantially same thickness as described above, a difference in bottom level between the lightly doped region 150 and the corresponding trench may be constant regardless of its position in the semiconductor chip 500, e.g., D1~D2. In example embodiments, a difference in bottom level between the lightly doped region 150 and the corresponding trench, e.g., D1–D2, may be smaller than the maximum height difference DD between bottom surfaces of the trenches, for example, D1–D2<DD/4.

The lightly doped regions 150 may be formed using an ion implantation process using the sacrificial patterns 141 and 142 as an ion mask. The ion implantation process may be performed to form independently the lightly doped regions 150 in NMOS and PMOS regions, respectively. The ion implantation process may be performed under a condition of ion energy, in which the maximum penetrating depth of ions is smaller than the thickness of the sacrificial patterns 141 and 142. Due to the use of this ion energy condition, it is possible to prevent or reduce the lightly doped regions 150 from being formed in the bottom surface of the trench.

In example embodiments, a portion of the buffer layer 130 over the sacrificial patterns 141 and 142 may be removed after the ion implantation process. In example embodiments, as shown in FIG. 8, buffer patterns 135 may be interposed between the sacrificial patterns 141 and 142 and the trenches 101 and 102. In example embodiments, the buffer layer 130 may be etched before the ion implantation process.

Figure 5:
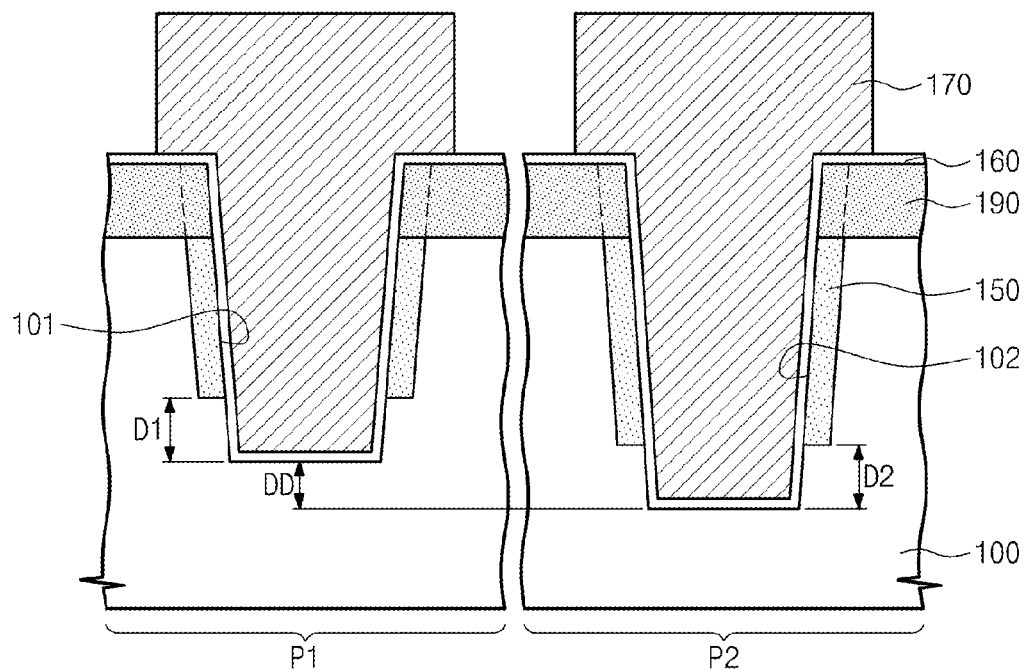

Referring to FIGS. 1 and 5, the sacrificial patterns 141 and 142 may be removed, a gate insulating layer 160 and a gate electrode 170 may be formed to fill the trenches 101 and 102, and heavily doped regions 190 may be formed in an upper region of the substrate 100 using the gate electrode 170 as a mask.

The removal of the sacrificial patterns 141 and 142 may be performed in an isotropic etching manner. For example, in the case in which the sacrificial patterns 141 and 142 is formed of a silicon nitride layer, an etch solution containing a phosphoric acid may be used to remove the sacrificial patterns 141 and 142. The second mask pattern 120 may be removed along with the sacrificial patterns 141 and 142 during the removal of the sacrificial patterns 141 and 142. The removal of the sacrificial patterns 141 and 142 may be performed using an etch recipe having an etch selectivity with respect to the buffer pattern 135 and/or the substrate 100. Thereafter, the buffer pattern 135 of FIG. 8 may be removed using an etch recipe having an etch selectivity with respect to the substrate 100.

Even in the case of using the etch recipes with the etch selectivity as described above, the sidewall of the trench over the sacrificial patterns 141 and 142 may be exposed to the etchants to be used during the removal of the sacrificial patterns 141 and 142 or the buffer pattern 135, thereby being laterally etched. For example, a portion of the trench over the sacrificial patterns 141 and 142 may be partially expanded. According to example embodiments of the inventive concepts, the trench may be formed to have a width monotonically decreasing with increasing its depth, despite the expansion. For example, the trench may have the maximum width around its upper entrance and the minimum width at its bottom.

In example embodiments, the gate insulating layer 160 may be a silicon oxide layer, which may be obtained from a thermal oxidation on an exposed surface of the trench, but example embodiments of the inventive concepts may not be limited thereto. For example, the gate insulating layer 160 may include at least one of high-k materials. The gate electrode 170 may include at least one of doped semiconductor materials, metals, or metal nitrides.

The heavily doped regions 190 may be formed in a top surface of the substrate 100 and be overlapped with the lightly doped regions 150. The ion implantation process may be performed to form independently the heavily doped regions 190 in NMOS and PMOS regions, respectively.

FIGS. 9 through 12 are sectional views illustrating a method of fabricating a semiconductor device according to example embodiments of the inventive concepts. For the sake of brevity, the elements and features of this example that are similar to those of the embodiments previously described with reference to FIGS. 2 through 8 will not be described in much further detail.

Figure 9:
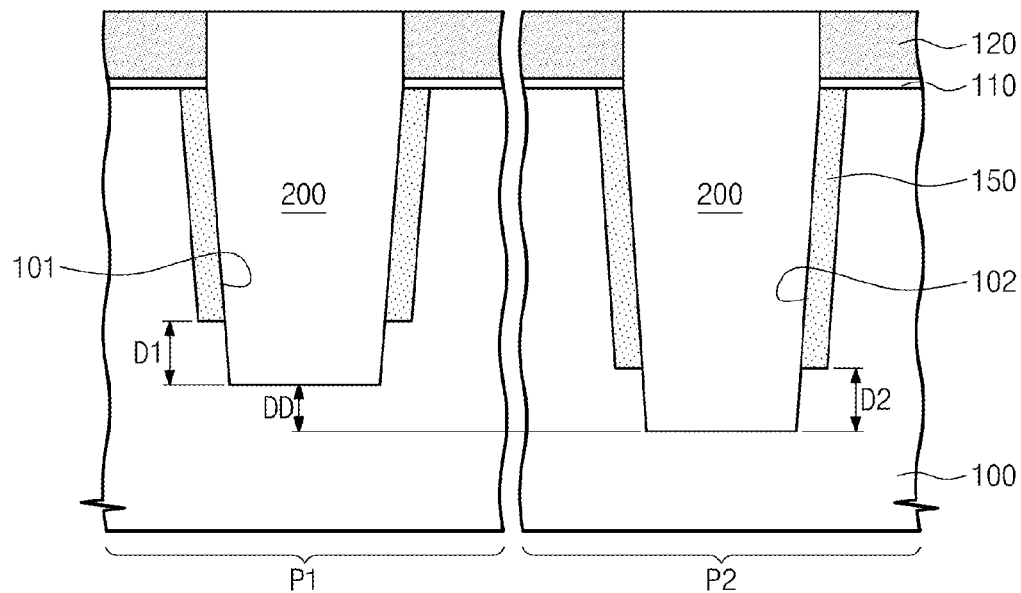

Referring to FIG. 9, the lightly doped regions 150 may be formed in sidewalls of the first and second trenches 101 and 102, and gap-filling patterns 200 may be formed to fill the first and second trenches 101 and 102. The lightly doped regions 150 may be formed using a fabricating method of the embodiments described with reference to FIGS. 2 through 4. Accordingly, even if the first and second trenches 101 and 102 have depths different from each other (e.g., HD>0), the lowest level of each lightly doped region 150 may be positioned at the same level from the bottom surface of the corresponding trench (e.g., D1~D2).

The gap-filling patterns 200 may be formed of at least one of insulating materials. For example, the gap-filling patterns 200 may be formed using a silicon oxide layer. The formation of the gap-filling patterns 200 may include forming an insulating gap-filling layer to fill the first and second trenches 101 and 102 and then planarizing the insulating gap-filling layer to expose the second mask pattern 120. Accordingly, the gap-filling patterns 200 may be locally formed in the first and second trenches 101 and 102. In example embodiments, the gap-filling patterns 200 may serve as device isolation patterns electrically isolating transistors from each other.

Figure 10:
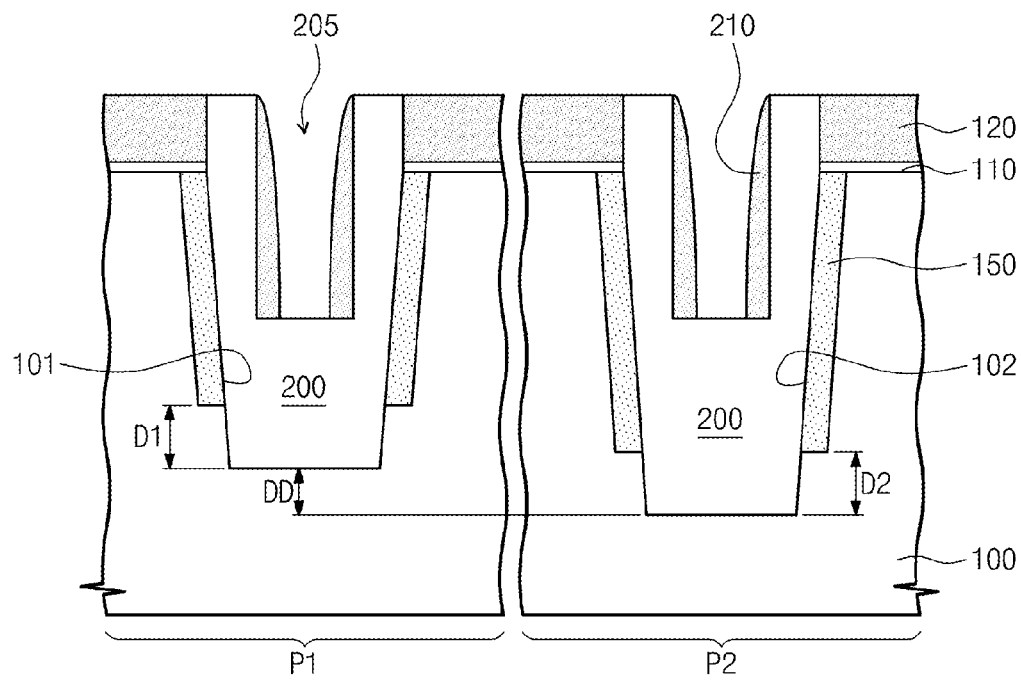

Referring to FIG. 10, the gap-filling patterns 200 may be patterned to form gap regions 205 in an upper region of each gap-filling pattern 200. Each of the gap regions 205 may be formed spaced apart from the sidewalls of the trenches 101 and 102. For example, each of the gap regions 205 may be formed to have a width smaller than the corresponding one of the trenches 101 and 102 adjacent thereto. Furthermore, a bottom surface of the gap region 205 may be formed spaced apart from the bottom surface of the corresponding trench. For example, as the result of the formation of the gap region 205, each of the gap-filling patterns 200 may have a vertical section shaped like a cup.

Inner spacers 210 may be formed on sidewalls of the gap regions 205. The inner spacers 210 may be formed to expose bottom surfaces of the gap regions 205. The inner spacers 210 may be formed of at least one of materials having an etch selectivity with respect to the gap-filling patterns 200. For example, in the case in which the gap-filling patterns 200 are formed of the silicon oxide layer, the inner spacers 210 may be formed of a silicon nitride layer.

Figure 11:
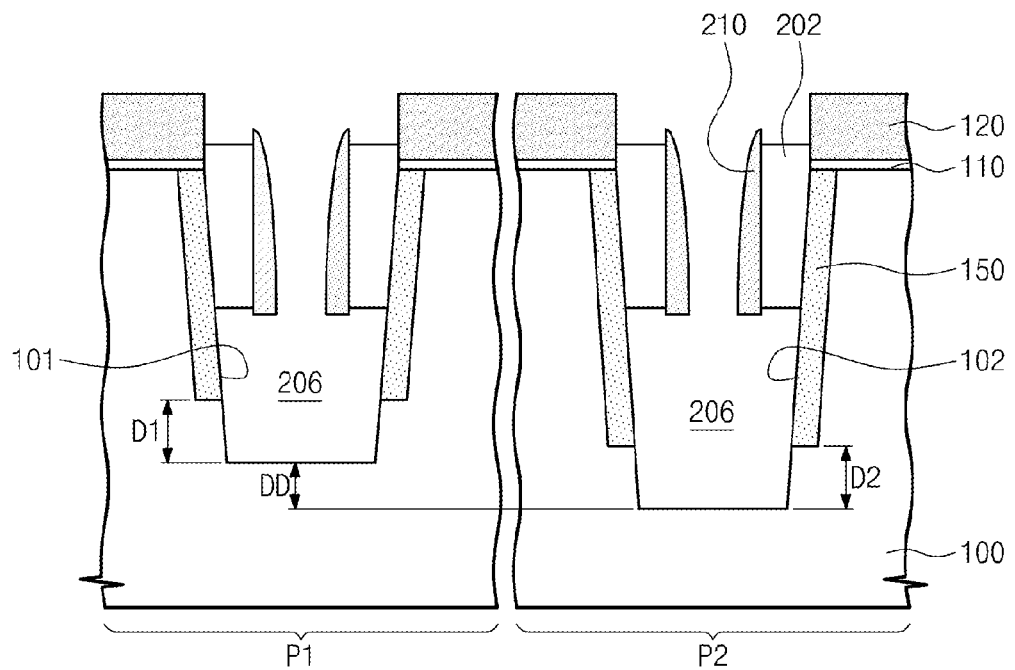

Referring to FIG. 11, the gap-filling pattern 200 may be etched using the inner spacers 210 as an etch mask to form a lower gate region 206 exposing a lower region of each of the trenches 101 and 102. Thus, the gap-filling pattern 200 may form an electrode separation pattern 202 locally remaining between an upper sidewall of the trench and the inner spacer 210. In example embodiments, as shown, an upper region of the gap-filling pattern 200 may be exposed by an etchant to be used in the etching step and be partially etched.

Figure 12:
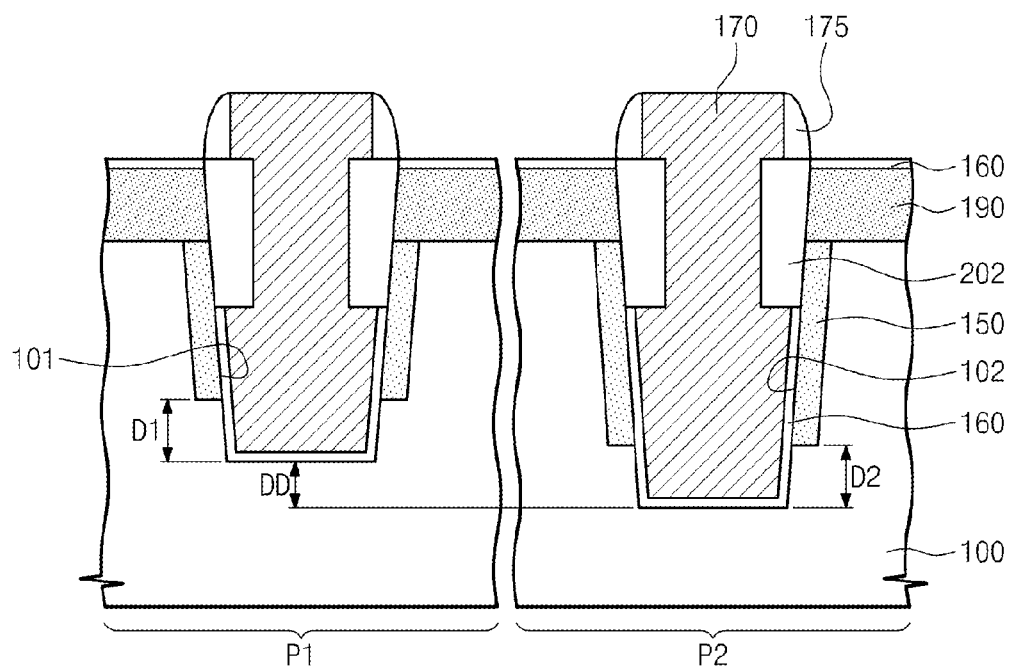

Referring to FIG. 12, the gate insulating layer 160 may be formed to cover the inner surfaces of the trenches 101 and 102 exposed by the lower gate regions 206, and the gate electrodes 170 may be formed to fill the trenches 101 and 102 provided with the gate insulating layer 160. Thereafter, gate spacers 175 may be formed on the sidewalls of the gate electrodes 170, and the heavily doped regions 190 may be formed in the upper region of the substrate 100 by using the gate spacers 175 as an ion mask.

Due to the presence of the electrode separation pattern 202, the gate electrodes 170 may be horizontally spaced apart from the heavily doped regions 190. According to example embodiments of the inventive concepts, a higher voltage of about 18-25V may be applied between the gate electrode 170 and the heavily doped region 19. Such a high voltage may lead to technical difficulties, e.g., gate-induced-drain-leakage (GIDL), in the conventional device, but according to example embodiments of the inventive concepts, the technical difficulties can be suppressed by the electrode separation pattern 202 horizontally separating the gate electrode 170 from the heavily doped region 190.

Figure 13:
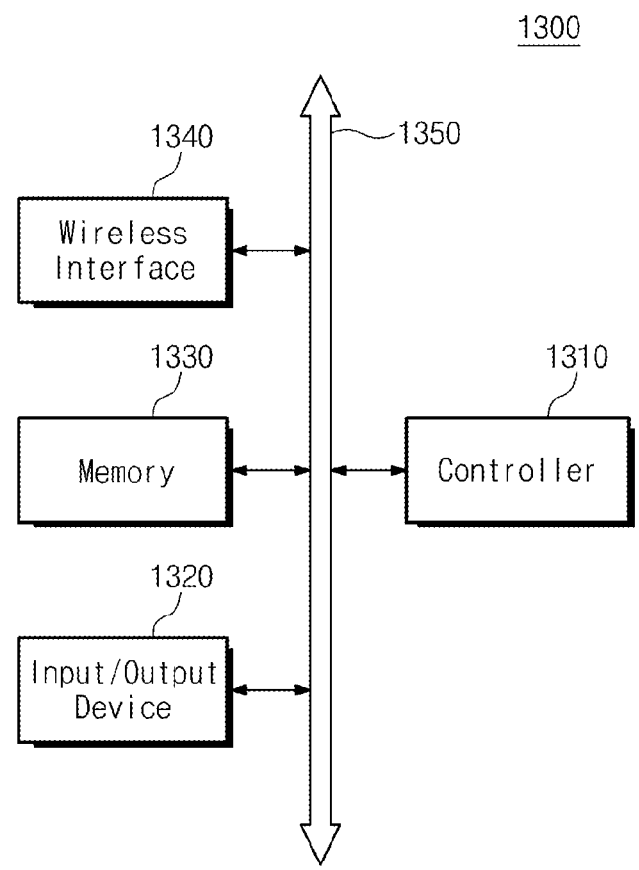
Figure 14:
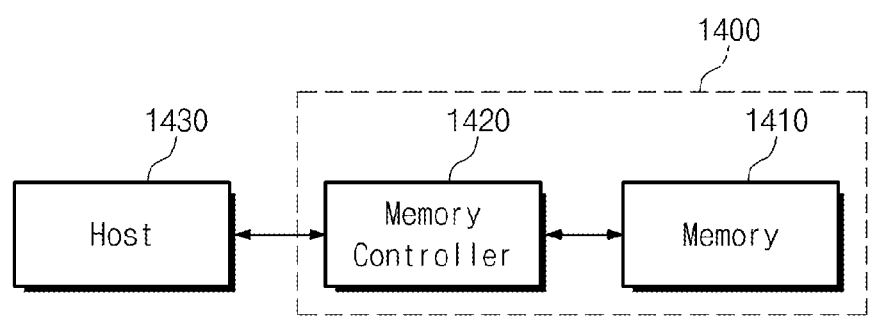

FIGS. 13 and 14 are block diagrams schematically illustrating electronic devices including a semiconductor device according to example embodiments of inventive concepts.

Referring to FIG. 13, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 (e.g., a keypad, a keyboard and/or a display), a memory 1330, and a wireless interface 1340 that are connected to each other through a bus 1350. The controller 1310 may include, for example, at least one microprocessor, a digital signal process, and/or a microcontroller. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna and/or a wireless transceiver. The electronic system 1300 may be used in a communication interface protocol of a communication system (e.g., CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and/or MMDS).

Referring to FIG. 14, a memory system including a semiconductor device according to example embodiments of inventive concepts will be described. The memory system 1400 may include a memory device 1410 for storing relatively large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

According to example embodiments of the inventive concepts, a method of fabricating a semiconductor device may include forming lightly doped regions in sidewalls of trenches using sacrificial patterns remaining on bottom surfaces of the trenches. Due to the use of the sacrificial patterns, it is possible to reduce a variation in height difference between the bottom surfaces of the trench and the lightly doped region, which enables improvement in the uniformity of structural and electric characteristics of the transistors.

Furthermore, the sacrificial patterns may be formed through a simplified process including a single deposition step and a single etching step of etching once a layer formed thereby. Due to this simplicity in the fabrication process, it is possible to reduce a fabrication cost and to improve the performance uniformity of electronic products with the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:

patterning a substrate to form trenches;

forming a sacrificial layer to cover inner surfaces of the trenches, the sacrificial layer having a single-layered structure;

forming sacrificial patterns by isotropically etching the sacrificial layer such that the sacrificial layer remains on bottom surfaces of the trenches;

forming lightly doped regions in sidewalls of the trenches using the sacrificial patterns as an ion mask;

removing the sacrificial patterns; and sequentially forming a gate insulating layer and a gate electrode layer in the trenches.

2. The method of claim 1, wherein the forming a sacrificial layer forms the sacrificial layer having a greater thickness on the bottom surfaces of the trenches than on the sidewalls of the trenches.

3. The method of claim 1, wherein the forming a sacrificial layer forms the sacrificial layer at least two times thicker on the bottom surfaces of the trenches than on the sidewalls of the trenches.

4. The method of claim 1, wherein the forming a sacrificial layer forms the sacrificial layer using a physical vapor deposition process.

5. The method of claim 1, wherein the patterning a substrate to form trenches includes patterning the substrate to form first and second trenches having different depths from each other, wherein the forming sacrificial patterns includes forming first and second sacrificial patterns on bottom surfaces of the first and second trenches, respectively, and wherein a difference in thickness between the first and second sacrificial patterns is smaller than one-fourth of a difference in depth between the first and second trenches.

6. The method of claim 1, further comprising:

forming a buffer layer to cover the inner surfaces of the trenches before the forming a sacrificial layer; and removing the buffer layer to expose the inner surfaces of the trenches after the removing the sacrificial patterns.

7. The method of claim 6, wherein the forming a buffer layer forms a silicon oxide layer, and the forming a sacrificial layer forms a material having an etch selectivity with respect to the buffer layer.

8. The method of claim 1, before the sequentially forming a gate insulating layer and a gate electrode layer in the trenches, further comprising:

forming electrode separation patterns remaining locally on upper sidewalls of the trenches, respectively.

9. The method of claim 8, wherein the forming electrode separation patterns comprises:

forming a trench insulating layer to fill the trenches after the removing the sacrificial patterns;

patterning an upper portion of the trench insulating layer to form gaps spaced apart from the lightly doped regions;

forming spacers on sidewalls of the gaps; and removing a lower portion of the trench insulating layer using the spacers.

10. The method of claim 1, after the sequentially forming a gate insulating layer and a gate electrode layer in the trenches, further comprising:

forming heavily doped regions in an upper region of the substrate to be connected to the lightly doped regions.

11. The method of claim 1, wherein the removing the sacrificial patterns includes laterally etching the sidewalls of the trenches exposed by the sacrificial patterns, such that a width of the trenches decreases in a downward vertical direction from the sacrificial patterns.

12. A method of fabricating a semiconductor device, comprising:

forming a sacrificial layer to cover inner surfaces and a bottom surface of trenches formed in a substrate;

forming sacrificial patterns by isotropically etching the sacrificial layer such that the sacrificial layer remains on bottom surfaces of the trenches;

forming lightly doped regions on the exposed inner surfaces of the trenches;

removing the sacrificial patterns; and sequentially forming a gate insulating layer and a gate electrode layer in the trenches.

13. The method of claim 12, wherein the forming lightly doped regions includes using the sacrificial patterns as an ion mask.

14. The method of claim 12, wherein forming a sacrificial layer forms the sacrificial layer having a single-layered structure.

15. The method of claim 12, wherein the forming a sacrificial layer forms the sacrificial layer having a greater thickness on the bottom surfaces of the trenches than on the inner surfaces of the trenches.

16. The method of claim 12, wherein the forming a sacrificial layer forms the sacrificial layer at least two times thicker on the bottom surfaces of the trenches than on the inner surfaces of the trenches.

17. The method of claim 12, wherein the forming a sacrificial layer forms the sacrificial layer using a physical vapor deposition process.

18. The method of claim 12, further comprising:

forming a buffer layer to cover the inner surfaces of the trenches before the forming a sacrificial layer; and removing the buffer layer to expose the inner surfaces of the trenches after the removing the sacrificial patterns.

19. The method of claim 18, wherein the forming a buffer layer forms a silicon oxide layer, and the forming a sacrificial layer forms a material having an etch selectivity with respect to the buffer layer.

* * * * *